United States Patent
Hsieh

(10) Patent No.: US 6,657,277 B1
(45) Date of Patent: Dec. 2, 2003

(54) METHOD FOR FORMING ANTIFUSE VIA STRUCTURE

(75) Inventor: Tsong-Minn Hsieh, Miao-Li (TW)

(73) Assignee: United Microelectronics Corporation, Hsin-Chu (TW)

( * ) Notice: Subject to any disclaimer, the term of this patent is extended or adjusted under 35 U.S.C. 154(b) by 0 days.

(21) Appl. No.: 10/199,358

(22) Filed: Jul. 19, 2002

(51) Int. Cl.⁷ .............................................. H01L 29/04
(52) U.S. Cl. ...................... 257/530; 257/209
(58) Field of Search ..................... 257/530, 50, 209; 438/131, 467, 600, 957

(56) References Cited

U.S. PATENT DOCUMENTS 5,070,384 A * 12/1991 McCollum et al. ..... 257/530 X
5,726,484 A * 3/1998 Hart et al. .................. 257/530

\* cited by examiner

*Primary Examiner*—Wael Fahmy, Jr.
*Assistant Examiner*—(Vikki) Hoa B. Trinh
(74) *Attorney, Agent, or Firm*—Merchant & Gould P.C.

(57) ABSTRACT

The present invention provides a method for forming an antifuse via structure. The antifuse via structures comprising a substrate that having a first conductive wire therein. Then, a first dielectric layer is formed on the substrate, and a photoresist layer is formed on the first dielectric layer. Next, an etching process is performed to etch the first dielectric layer to form a via open in the first dielectric layer. Then, a first conductive layer is deposited to fill the via open and performing a polishing process to form a conductive plug, wherein the conductive plug is on the first conductive wire. Next, a buffer layer deposited on the partial first dielectric layer and on the surface of conductive plug. Then another polishing process is performed to the buffer layer to expose the portion of the conductive plug. Thereafter, a first electrode of capacitor is deposited on the buffer layer. Next, a second dielectric layer is formed on the first electrode and an intentionally misaligned process is performed to second dielectric layer to form an antifuse via open, such that the breakdown will be occurred on the corner of the first via, wherein the antifuse via open intentionally misaligned to the conductive plug. Then, a third dielectric layer and a second electrode of the capacitor are subsequently formed on the portion of the second dielectric layer and on sidewall of the antifuse via open. Finally, a second conductive wire is formed on the second electrode.

4 Claims, 3 Drawing Sheets

METHOD FOR FORMING ANTIFUSE VIA STRUCTURE

BACKGROUND OF THE INVENTION

1. Field of the Invention

The present invention generally relates to an antifuse via structure, and more particularly to a method of a metal via antifuse used in field programmable gate array (FPGA) for forming an antifuse via structure.

2. Description of the Prior Art

Referring to FIG. 1, a structure of conventional via antifuse used in FPGAs. The conventional antifuse via structure comprises a substrate 100 having a first conductive wire 102 therein. A first dielectric layer 104 covers on the substrate 100 and first conductive wire 102. Then, a photoresist layer (not shown in FIG.) is formed on the first dielectric layer 104, and performing an etching process to the first dielectric layer to expose partial conductive wire 102 to form a via open 106 in the first dielectric layer 104. Then, a first conductive layer is deposited on the first dielectric layer 104 and to fill the via open 106, wherein the via open 106 is on the first conductive wire 102. Then, a polishing process such as chemical mechanical polishing (CMP) is performed to remove the excess first conductive layer to form a conductive plug 108.

Then, referring to FIG. 2, a buffer layer 110 is deposited before the formation of the first electrode 112. Next, another CMP process is performed to the buffer layer 108 to remove portion of the buffer layer 110 on the surface of the conductive plug 108 to expose the portion of the conductive plug 108. Then, a first electrode 112 of the capacitor is deposited on the buffer layer 108 by chemical vapor deposition method. Next, a second dielectric layer 114 is deposited on the first electrode 112, wherein the second dielectric layer 114 comprises a silicon nitride layer with thickness of about 30 angstroms and a silicon oxide layer with thickness of about 130 angstroms thereon. Then, a second electrode 116 of the capacitor is formed on the second dielectric layer 114. The thickness of the second electrode 116 is thicker than the first electrode 112 as shown in FIG. 2.

Therefore, a capacitor structure composes of the first electrode 112, the second dielectric layer 114, and the second electrode 116. Thereafter, as a key feature of the conventional metal via antifuse process, a third dielectric layer 118 such as silicon dioxide layer is deposited on the second electrode 116 by CVD method. Then, referring to FIG. 3, a photoresist layer (not shown) with an antifuse via pattern is formed on the third dielectric layer 118 by alignment process. Next, an etching process is performed to form an antifuse via open 120 in the third dielectric layer 118. Then, a second conductive wire 122 is deposited to fill the antifuse via open 120 and on the third dielectric layer 118.

The disadvantage for the conventional antifuse via structure is that the large capacitor area with lager capacitance, due to the first conductive layer is deposited to fill the tungsten keyhole such that the device processes with lower speed. The capacitor area can be calculated by formula $\pi*(D/2)^2$, wherein the $\pi$ is 3.14, D is width of the second dielectric layer 114, herein the width value of the second dielectric layer 114 is of about 0.52 um. Therefore, according to the formula, we can obtain the values of flat capacitor area is 0.212 um$^2$. Furthermore, another disadvantage is that the thin dielectric layer (second dielectric layer 114) is very difficult to control by plasma-enhanced chemical vapor deposition method especially for 0.15 um integrated circuit fabricating process.

SUMMARY OF THE INVENTION

It is an object of this invention to reduce the capacitance of the antifuse via structure.

It is another object of this invention to keep the thickness of the dielectric layer at the bottom of antifuse via such that the proper dielectric thickness of antifuse can be obtained.

It is still another object of this invention to utilize an intentionally misaligned process of antifuse via to the metal plug such that the breakdown can be occurred on the corner of metal plug to keep the same as the current antifuse.

According to abovementioned objects, the present invention provides a structure for improving the capacitance of the antifuse via structure. The antifuse via structure comprises a substrate having a first conductive wire therein, and a first dielectric layer having a conductive plug on the substrate. Then, a buffer layer is on the first dielectric layer and partial conductive plug. Next, a first conductive layer is on the buffer layer, wherein the first conductive layer used as first electrode of the capacitor. Then, a second dielectric layer is on the first electrode. Next, as another key feature of the present invention, an antifuse via open in the second dielectric layer such that the capacitor area is smaller than the conventional flat area. Then, a third dielectric layer is on the second dielectric layer and on sidewall of antifuse via open. Thereafter, a second electrode of capacitor is on the third dielectric layer. Then, a second conductive wire is on the top of the second electrode. The advantage of the present invention is that the dielectric thickness of antifuse at the bottom of antifuse via is much thinner than on the flat area. Therefore, the dielectric can be kept as thick as before, and. proper the dielectric thickness of antifuse can be obtained by changing the antifuse via profile or aspect ratio.

Furthermore, the present invention provides a method for forming an antifuse via structure comprising a substrate having a first conductive wire therein. Then, a first dielectric layer is formed on the substrate, and a photoresist layer with a via pattern is formed on the first dielectric layer. Next, an etching process is performed to first dielectric layer to form a via, open in the first dielectric layer. Then, a first conductive layer is deposited to fill the via open and performing a polishing process to remove portion of the first conductive layer to form a conductive plug. Next, a buffer layer is deposited on the partial first dielectric layer and on the conductive plug, and another polishing process is performed to remove the partial buffer layer on the conductive plug to expose partial conductive plug. Thereafter, a first electrode of capacitor is deposited on the buffer layer. Then, a second dielectric layer is deposited on the first electrode. Next, as a key step of the present invention, an intentionally misaligned process is performed to form an antifuse via open such that the breakdown will be occurred on the corner of the conductive plug. Thus, the current antifuse can be kept as before. The steps of forming antifuse via open include a photoresist layer is formed on the second dielectric layer by an intentionally misaligned process. Then, an etching process is performed to remove portion of the second dielectric layer to form an antifuse via open in second dielectric layer. After removing the photoresist layer, the third dielectric layer is deposited on second dielectric layer and on the sidewall of the antifuse via open. Next, a second electrode of the capacitor is deposited on the partial second dielectric layer. Thereafter, a second conductive wire is formed on the second electrode.

The advantage for the process of the present invention is that the capacitor area will be shrunk such that the capacitance can be diminished as low as ⅓ of the original data.

Furthermore, the thickness shrinking of the dielectric layer in plasma-enhanced chemical vapor deposition method can be also easily performed for 0.15 um integrated circuit fabrication process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

According to the present invention is to provide a process of metal via antifuse used in field programmable gate array (FPGA) to improve the capacitance of the semiconductor device. The antifuse via structure includes a substrate having a first conductive wire and a first dielectric layer having a via open, wherein the first dielectric layer is on the substrate. Then, a first electrode of the capacitor is on the first dielectric layer and the conductive plug. Next, as a key feature of the present invention, a second dielectric layer having an antifuse via open, wherein the antifuse via open is intentionally misaligned to the conductive plug, and the portion of the second dielectric layer is on portion of the first electrode and to expose partial first electrode. Then, a third dielectric layer is on the second dielectric layer and on the sidewall of the antifuse via open. Next, a second electrode is on the third dielectric layer. Finally, a second conductive wire is on the second electrode, and electrically coupled to the second electrode. The advantages is that the second dielectric layer having an antifuse via open, and the antifuse via open misaligned to the conductive plug such that the capacitance area is smaller then the conventional antifuse via structure. Thus, the capacitance can be obtained as low as ⅓ of original data.

Figure 1:
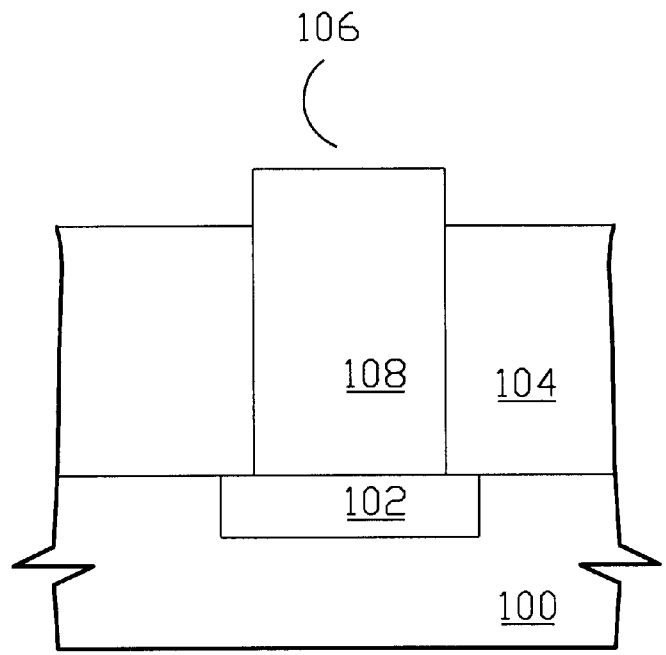
FIGS. 1 to 3 are schematic representation of structures at various stages during the formulation of a conventional antifuse via in field programmable gate array (FPGA) structure using conventional, prior art technique.
Figure 2:
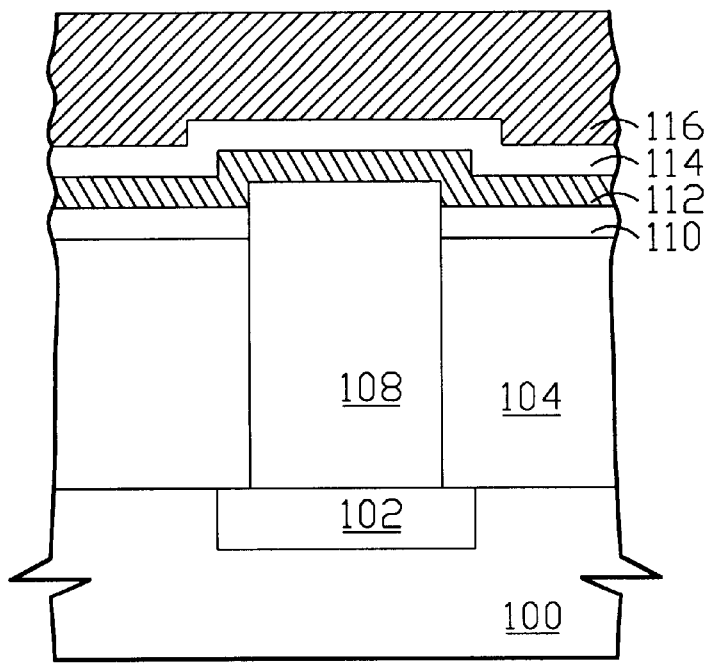
Figure 3:
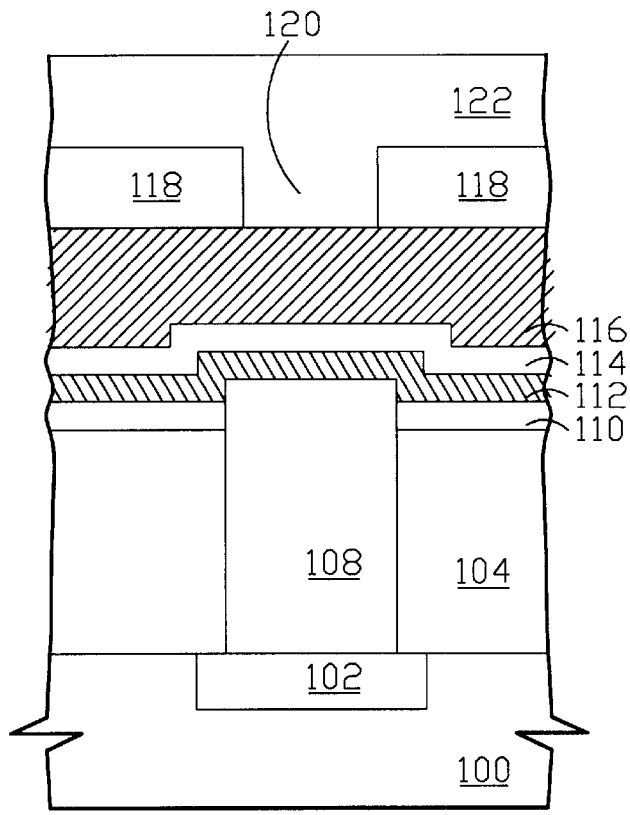
Figure 4:
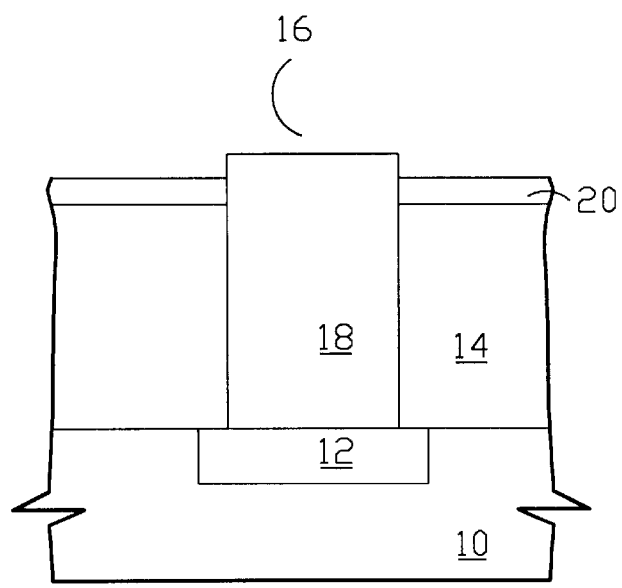
FIG. 4 is a schematic representation for forming first dielectric layer having a conductive plug on a substrate having a prior conductive wire therein in accordance with a method disclosed herein.

Referring to FIG. 4, a first dielectric layer 14 is formed on the substrate 10, wherein the substrate 10 having a first conductive wire 12 therein. Then, a photoresist layer (not shown) with a via pattern is formed on the first dielectric layer 14, and then performing an etching process to form a via open 16 in the first dielectric layer 14. Next, a first conductive layer such as tungsten (W) is deposited on the first dielectric layer 14 and to fill the via open 16. Then, a polishing process such as chemical mechanical polishing is performed to the first conductive layer to form a conductive plug 18. Thereafter, a buffer layer 20 is deposited on the first dielectric layer 14, and performing another CMP process to remove the portion of buffer layer 20 to expose portion of conductive plug 18 wherein the material of buffer layer 20 comprises a silicon dioxide.

Figure 5:
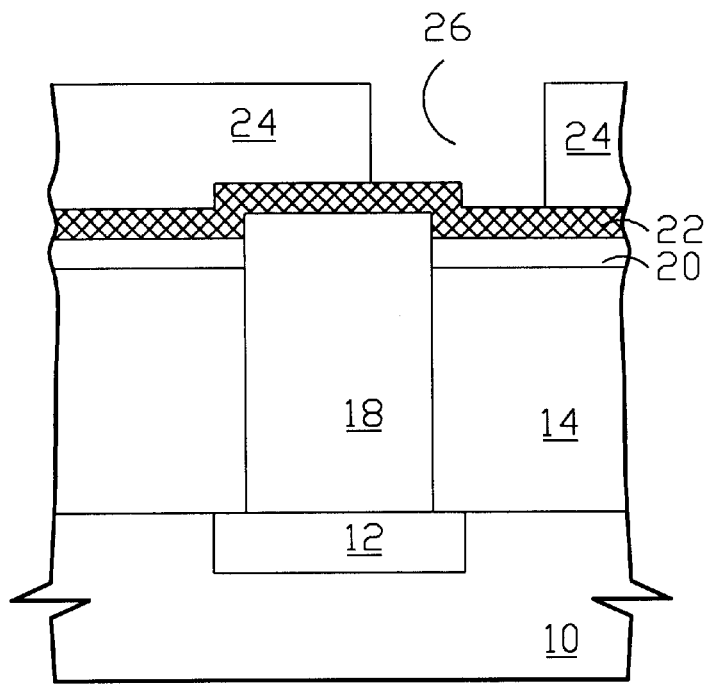
FIG. 5 is a schematic representation of the antifuse via open formed on the conductive plug by an intentionally misaligned process in accordance with a method disclosed herein.

Next, referring to FIG. 5, a first electrode 22 of the capacitor is deposited on the buffer layer 20 and on the exposed surface of conductive plug 18 by chemical vapor deposition method, wherein material of the first electrode 22 can be TiN (titanium nitride.) Then, as a key step of the present invention, an intentionally misaligned process is performed to form an antifuse via open to via open 16, that is, to guarantee the breakdown is occurred on the corner of plug 18. Therefore, the breakdown can be kept the same as the conventional antifuse. According to abovementioned advantages, the steps of formation of antifuse via open includes a second dielectric layer 24 is deposited on the first electrode 22, wherein the material of second dielectric layer 24 can be silicon oxide, silicon dioxide, oxide/nitride/oxide (ONO) layer and amorphous polysilicon. Then, a photoresist layer (not shown) having an antifuse via pattern is formed on the second dielectric layer 24 by an intentionally misaligned process. Next, an etching process is performed to remove partial second dielectric layer 24 to form an antifuse via open 26 in the second dielectric layer 24, wherein the antifuse via open 26 misaligned to the conductive plug 18.

Figure 6:
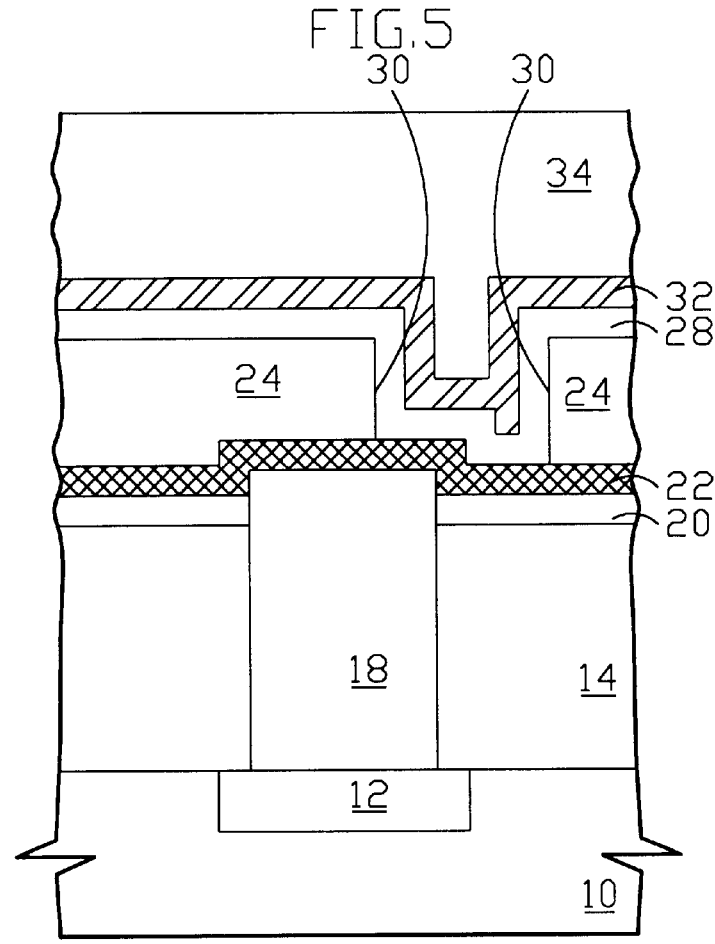
FIG. 6 is a schematic representation of the antifuse via structure in a field programmable gate array in accordance with a method disclosed herein.

Then, as another key step of the present invention, referring to FIG. 6, a third dielectric layer 28 is formed on the second dielectric layer and on sidewall 30 of the antifuse via open 26 by plasma-enhanced chemical vapor deposition (PECVD) method, after the antifuse via open 26 is formed in the second dielectric layer 24 such that the capacitor can be obtain capacitance as low as ⅓ of original data. Furthermore, another advantage is that due to the shadow effect of PECVD method, the dielectric thickness of antifuse at the bottom of antifuse via is much thinner than. that on the flat area. For example, for 0.15 um integrated circuit fabrication processes, the capacitor area can be calculated by formula $\pi*(D/2)^2$, wherein $\pi$ is 3.14, D is width of the third dielectric layer 28, herein the width of the third dielectric layer 28 of about 0.3 um. Therefore, according to the formula, we can obtain the capacitor area is of about 0.07 $um^2$. To compare with the conventional flat capacitor area is of about 0.212 $um^2$, the present invention only has ⅓ capacitor area of the original data.

Therefore, the third dielectric layer 28 can be kept as thick as before, and the proper dielectric thickness of antifuse can be obtained by changing the antifuse via profile or aspect ratio. Next, a second electrode 32 of the capacitor is formed on the third dielectric layer 28 by sputtering method or chemical vapor deposition method. The material of the second electrode 32 can be the same as the first electrode 22. Thereafter, a second conductive wire 34 is formed on the second electrode 32, and electrically coupled to the second electrode 32.

According to abovementioned,. we can obtain the advantages of the present invention as, following:

Firstly, according to FIG. 5, an intentionally misaligned process is performed to form an antifuse via open to via open 16, that is, to guarantee the breakdown is occurred on the corner of conductive plug. Therefore, the breakdown can be kept the same as the conventional antifuse.

Secondly, according to FIG. 6, the third dielectric layer is deposited after the formation of antifuse via open in the second dielectric layer such that the capacitor area is smaller than the conventional antifuse via structure on the flat area, and the capacitance of the capacitor can be obtained as low as ⅓ of original data.

Thirdly, according to FIG. 6, due to the dielectric thickness of antifuse via at the bottom of antifuse via is much thinner than that on flat area such that the thickness of dielectric layer can be kept as thick as before, and the dielectric thickness of antifuse can be obtained by changing the antifuse via profile or aspect ratio. Therefore, the present invention can solve the thickness shrinking in PECVD method in 0.15 um fabrication process.

Although specific embodiments have been illustrated and described, it will be obvious to those skilled in the art that various modifications may be made without departing from what is intended to be limited solely by the appended claims.

What is claimed is:

1. A antifuse via structure, said antifuse via structure comprising:

a substrate having a first conductive wire therein and a first dielectric layer having a conductive plug on said substrate;

a buffer layer on portion of said first dielectric layer;

a first electrode on portion of said first dielectric layer and on portion of said conductive plug;

a second dielectric layer having an antifuse via open on said first electrode, wherein said antifuse via open intentionally misaligned to said conductive plug;

a third dielectric layer on said second dielectric layer and on sidewall of said antifuse via open;

a second electrode on said third dielectric layer; and a second conductive wire on said second electrode.

2. The metal via antifuse structure according to claim 1, wherein said first electrode comprises titanium nitride.

3. The metal via antifuse structure according to claim 1, wherein material of said second dielectric layer is selected from a group consisting of a silicon oxide, a silicon nitride, an oxide/nitride/oxide layer, and an amorphous polysilicon.

4. The metal via antifuse structure according to claim 1, wherein said second electrode comprises titanium nitride.

* * * * *